FUSED-JUNCTION SILICON DIODES

Filed May 10, 1954

INVENTOR.
SANFORD H. BARNES,
BY Henry Heyman
ATTORNEY.

United States Patent Office 2,736,847

Patented Feb. 28, 1956

2,736,847

FUSED-JUNCTION SILICON DIODES

Sanford H. Barnes, Los Angeles, Calif., assignor to Hughes Aircraft Company, Culver City, Calif., a corporation of Delaware Application May 10, 1954, Serial No. 428,679

11 Claims. (Cl. 317—234)

This invention relates to fused-junction silicon diodes, and more particularly to a hermetically sealed, miniaturized and temperature insensitive fused-junction silicon diode having exceptional electrical characteristics, and to methods for making the diode.

It has long been known in the semiconductor art that monatomic semiconductors, such as germanium and silicon, may be employed as the semiconductor element in semiconductor rectifiers or diodes. More particularly, in the prior art both of these materials have been employed successfully in point-contact diodes wherein a pointed whisker element is stressed against a germanium or silicon crystal to form a rectifying contact.

In more recent years, a new form of semiconductor rectifier has been produced, this rectifier being termed a "fused junction diode" and including a germanium crystal specimen in which a P–N junction has been formed by converting a portion of a germanium specimen of one conductivity type to the opposite conductivity type. The term P–N junction is employed in the semiconductor art to signify that a continuous solid specimen has both an N-type region containing an active impurity of the donor type and in which electrical conduction is by electrons, and a P-type region containing an excess of an active impurity of the acceptor type and in which electrical conduction is by holes, the junction of the P-and-N type regions constituting a rectifying barrier. The term "active impurities" is used to denote those impurities which affect the electrical characteristics of semiconductor material as distinguishable from other impurities having no appreciable effect upon these characteristics. Active impurities are classified either as donors, such as phosphorus, arsenic, antimony, and bismuth, or acceptors, such as gallium, aluminum, indium, and thallium.

In the prior art, germanium P–N junction semiconductor devices have been produced by fusing small amounts of a low-melting-point acceptor impurity with portions of an N-type germanium starting specimen. According to this prior-art method, a predetermined amount of a low-melting-point acceptor impurity, such as indium, for example, is placed in contact with a surface of an N-type germanium specimen. The specimen and the contacting indium are then heated to a value of temperature above the melting point of indium, but below the normal melting point of germanium, in order to melt the indium and dissolve therein a portion of the adjacent germanium. The specimen is then cooled so that the dissolved germanium and atoms of indium are regrown onto the specimen, thereby producing an indium-saturated P-type region in the semiconductor specimen.

It has been long recognized in the semiconductor art that silicon has many physical advantages over germanium, in particular its ability to withstand relatively high operating temperatures. Nevertheless, fused-junction silicon diodes have not been produced heretofore, owing to the fact that the production techniques which have been found suitable for producing fused-junction germanium diodes are not adaptable to the production of fused-junction silicon diodes. More particularly, the production of fused-junction silicon diodes has been complicated by several basic factors. Firstly, it is difficult to make a good ohmic electrical connection to silicon, the more conventional techniques employed for connecting to germanium having been found to produce with silicon relatively high impedance connections, which in many instances are asymmetrically conductive. Secondly, the inherent tendency of silicon toward rapid formation of extremely hard and stable oxide has rendered it difficult to create fused-junction silicon diodes because of the inability of the active impurity employed in the fusion process to wet the adjacent surface of the silicon. Thirdly, the relatively high melting point of silicon and its characteristic brittleness, together with the relatively low solubility of silicon of the active impurities have contributed to make it exceedingly difficult to produce even a mediocre fused-junction silicon diode.

The present invention overcomes the above and other difficulties which have heretofore limited the use of silicon and provides fused-junction silicon diodes which have exceptional electrical characteristics and which are, in addition, hermetically sealed and structurally temperature insensitive. According to the basic concept of the present invention, methods are disclosed for producing a non-rectifying low-impedance electrical connection to a silicon starting specimen and for creating a fused junction within the specimen by fusing thereto an alloy of a solvent metal, such as gold, which is capable of readily dissolving silicon and which has a high rejection ratio relative to silicon, and an active impurity of the type opposite to that which determines the conductivity of the original starting specimen.

More particularly, according to a preferred embodiment of the invention, the fused-junction silicon diode of the invention includes a P-type silicon crystal element to which a low impedance connection is produced by heating the crystal element in a vacuum and sequentially evaporating on one surface thereof a stratum of aluminum and a stratum of gold to form a metallic layer intimately bonded to the crystal element and in ohmic contact therewith. In addition, the present invention provides methods for converting a region of the P-type silicon crystal element to N-type silicon by fusing to the crystal element a predetermined amount of a low-melting point alloy of a donor impurity, such as antimony, and a solvent metal, such as gold.

According to the methods of the invention, the alloy, which may be in either pellet or wire form, is placed in contact with the silicon crystal element which is heated to a predetermined value of temperature above the melting point of the alloy, but below the melting point of silicon, thereby melting the alloy and dissolving therein the adjacent region of the silicon specimen. The combination is then cooled to regrow onto the undissolved portion of the crystal element the dissolved silicon, together with substituted atoms of antimony, thereby creating an N-type silicon region in the crystal element. Further cooling of the combination thereafter solidifies the gold from the original alloy, together with the remaining atoms of antimony and silicon, as an alloy button in ohmic contact with the newly created N-type region.

This invention also provides novel methods for mounting the fused-junction silicon crystal element thus created in a unitary vitreous envelope with two associated electrodes in ohmic contact with the N-and-P type regions, respectively, of the silicon crystal element. In particular, a novel method is disclosed for mounting the crystal element by connecting the metallic layer deposited thereon to an associated electrode by polymerizing an insulative thermosetting compound, containing finely divided electrically conductive particles which ohmically interconnect the electrode with the metallic layer on the crystal element.

Among the numerous advantages of the fused-junction silicon diode of the invention are its abilities to withstand temperatures of the order of 300° C. or higher without structural deterioration, to dissipate relatively large amounts of power and to provide exceedingly high rectification ratios with forward currents of the order of 15 milliamperes. In addition, the fused-junction silicon diodes of the invention have relatively high saturation or zener voltages with reverse currents of the order of a fraction of a microampere.

It is therefore, an object of this invention to provide hermetically sealed fused-junction silicon diodes which are structurally temperature insensitive and have exceptionally high rectification ratios.

An additional object of the invention is to provide fused-junction silicon diodes in which a metallic layer, composed of successive strata of an active impurity and gold, is employed to create an ohmic and non-rectifying connection with a silicon crystal element.

Another object of the invention is to provide fused-junction silicon diodes in which a P-type junction is created in a silicon starting specimen by fusing to the specimen an alloy of predetermined constituency.

Still another object of the invention is to provide fused-junction silicon diodes in which an N-type region is created in a P-type silicon crystal element by fusing to the crystal element an alloy of antimony and gold.

An additional object of the invention is to provide fused-junction silicon diodes in which a silicon crystal element having a metallic layer deposited on one surface thereof is mounted on an associated electrode by polymerizing a thermosetting insulative binder having dispersed thereon a plurality of electrically conductive particles to form a mechanically rugged, temperature insensitive, and non-rectifying connection between the metallic layer and the electrode.

It is also an object of the invention to provide fused-junction silicon diodes in which a silicon crystal element is hermetically encapsulated in a unitary vitreous envelope.

It is still another object of the invention to provide methods for producing a low-impedance non-rectifying connection to a P-type silicon crystal element by evaporating on one surface of the crystal element successive layers of aluminum and gold.

It is still an additional object of the invention to provide methods for creating a P–N junction in a P-type silicon crystal element by fusing to the crystal element an alloy including a solvent metal, such as gold, and a donor impurity, such as antimony.

It is a further object of the invention to provide methods for producing a fused-junction silicon diode by creating a regrown N-type region in a P-type silicon starting specimen, forming ohmic and non-rectifying connections to the N-and-P type regions and enclosing the crystal element in a vitreous envelope.

The novel features which are believed to be characteristic of the invention, both as to its organization and method of operation, together with further objects and disadvantages thereof, will be better understood from the following description considered in connection with the accompanying drawings in which one embodiment of the invention is illustrated by way of example. It is to be expressly understood, however, that the drawings are for the purpose of illustration and description only, and are not intended as a definition of the limits of the invention.

Figures 1, 2, 3A, 3B, 3C, 4, 5, 6, 7, 8:
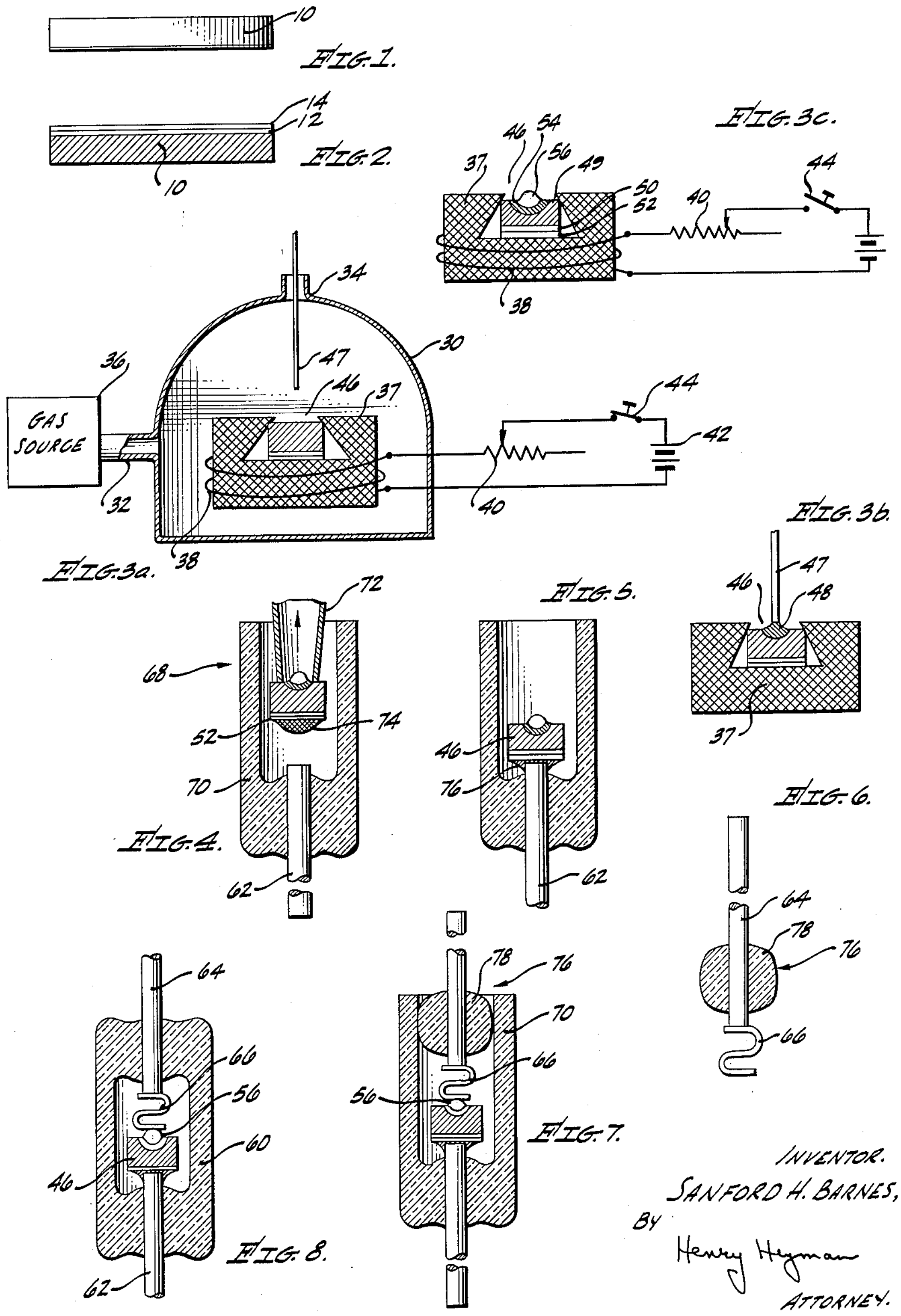
Fig. 1 is a diagrammatic view of a silicon wafer which is to be processed to provide a plurality of silicon crystal elements for the fused-junction silicon diode of the invention.
Fig. 2 is a sectional view of the silicon wafer shown in Fig. 1, illustrating the formation of an ohmic contact with the bulk of the wafer by the deposition upon the wafer of a metallic layer.

Figs. 3*a*, 3*b* and 3*c* are schematic views, partly in section, illustrating a preferred method and apparatus for creating the fused junction in the silicon crystal element employed in the fused-junction silicon diode of the invention;

Fig. 4 is a sectional view illustrating one method and apparatus for mounting the silicon crystal element produced according to the methods of the invention;

Figs. 5 and 6 are sectional views of the crystal and contact assemblies which are combined to form the fused-junction silicon diode of the invention;

Fig. 7 is a sectional view of the fused-junction silicon diode of the invention illustrating the final sealing operation, according to the method of the invention; and Fig. 8 is a sectional view of the completed fused-junction silicon diode of the invention.

Referring now to the drawings, there is shown in Fig. 1 a silicon wafer 10 which has been cut from an ingot of P-type silicon and which is to be processed as described hereinbelow, to provide a plurality of individual silicon crystal elements for the fused-junction silicon diodes of the invention. Wafer 10 is preferably either a single crystal of silicon or a polycrystalline specimen in which the individual single crystals are relatively large, thereby ensuring that the specimen contains relatively few grain boundaries. The resistivity of the wafer is preferably within the range from .5 ohm-centimeter to 20 ohm-centimeters, the specific resistivity of the silicon being selected in view of the electrical characteristics desired in the completed fused-junction silicon diode. The resistivity of the material and its effect on the electrical characteristics of the diode will be described in more detail hereinbelow.

After the wafer has been cut from the ingot, it is first lapped to a predetermined thickness of the order of .030 of an inch to remove surface ridges produced by the cutting operation and to provide a uniformly thick specimen. In addition, the lapping operation is utilized for controllable roughening of the wafer's surfaces in order to facilitate the carrying out of the fusion operations to which the wafer is subsequently subjected. One commercially available lapping compound which has been satisfactorily employed for performing the lapping operation is 400 mesh alundum abrasive.

After the lapping operation has been performed, wafer 10 is preferably etched for a determinate period in any one of several suitable etchants known to the art to remove surface imperfections. The etching step may be carried out, for example, by immersing the wafer for five seconds in a solution containing five parts concentrated nitric acid and one part hydrofluoric acid. The wafer is then preferably rinsed in distilled water, followed by a second rinse in absolute methyl alcohol.

The next step in the production of the fused-junction silicon diode of the invention is the formation of a non-rectifying and ohmic connection to the wafer, according to the methods of the invention, in order to provide subsequently a low-impedance electrical connection to the individual silicon crystal elements when they are mounted in the completed diodes. This operation is one of the most important steps in the production of the fused-junction silicon diodes of the invention and consists of depositing a metallic layer in intimate contact with one surface of wafer 10.

More particularly, the metallic layer deposited upon the wafer is composed of two strata or layers, one layer being of an acceptor impurity, such as aluminum, which is deposited upon a surface of the wafer, and the other layer being of gold which is deposited over the layer of aluminum. In carrying out the deposition of the metallic layer, wafer 10 is first removed from the alcohol rinse and is placed immediately in a vacuum chamber which is evaporated to provide a vacuum of the order of 10-4 millimeters of mercury. Simultaneously, the wafer is heated to a value of temperature of the order of 800° C., this operation being carried out by positioning the wafer upon a suitable heater element, such as a kanthol strip, for example, which is energized from an external source of electrical energy.

After the desired vacuum has been achieved and the wafer has been heated to the proper temperature, the layer of aluminum is evaporated upon the exposed surface of the wafer. One manner in which the evaporation process may be carried out is by first fusing a length of .015 aluminum wire to a tungsten filament and then heating the aluminum to a temperature of the order of 1250° C. for approximately 15 minutes by passing a current through the tungsten filament. As the aluminum layer is deposited upon the wafer, a portion of the aluminum is diffused into the adjacent region of the P-type silicon wafer and creates a resistivity gradient therein by overdoping the adjacent region of the wafer and thereby lowering its resistivity. Accordingly, a gradual transition in resistivity is produced between the bulk of the silicon wafer and the aluminum layer.

At the completion of the aluminum evaporation step, or shortly therebefore, the deposition of the gold layer over the initial layer of aluminum is begun. This process may be carried out by coiling a .012 gold wire on two tungsten basket filaments and passing a current through the filaments to raise the temperature of the gold to 1450° C. for approximately 30 minutes. It has been found that simultaneous evaporation of both aluminum and gold for a relatively short interval provides a better transition region between the layer of aluminum and the layer of gold, thereby providing an exceptionally low impedance connection between the gold layer and the bulk of the silicon wafer.

Referring now to Fig. 2, wafer 10 is shown after the above-described deposition process has been carried out. The wafer now includes an aluminum layer 12 in ohmic contact with one surface of the original silicon specimen and a gold layer 14 in ohmic contact with the aluminum layer and hence with the silicon material of the starting specimen. The wafer is now diced into a plurality of individual crystal elements of a size suitable for mounting in the fused-junction silicon diodes of the invention.

One method which has been found satisfactory for dicing wafer 10 into individual crystal elements is to invert the wafer and glue it to a porcelain plate with a shellac, for example, the wafer being oriented so that the gold layer is in contact with the porcelain. The wafer is then etched for approximately 30 seconds in a suitable etching solution, such as a solution containing 50 parts nitric acid, 45 parts hydrofluoric acid, and 10 parts acetic acid. The wafer is then rinsed in alcohol and dried, after which the wafer is diced into individual crystal elements with a suitable instrument such as a diamond saw, for example. The individual crystal elements are then re-etched in substantially the same manner set forth above to remove any surface imperfections created by the dicing operation, rinsed in alcohol, and removed from the porcelain plate by dissolving the shellac with a suitable solvent, such as a solution of 50% trichlor ethylene, 48% ethyl alcohol, and 2% acetic acid.

Each of the P-type silicon crystal elements is now ready for the formation therein of a P–N junction by the conversion of a portion of the P-type silicon to N-type silicon by carrying out the fusion operation described hereinbelow. It should be pointed out that the fusion operation is performed immediately after the crystal elements have been etched and should be carried out in either a vacuum or non-oxidizing atmosphere to prevent the formation of silicon dioxide on the crystal elements.

According to the basic concept of the invention, the formation of the P–N rectifying junction in each crystal element may be accomplished by either one of two similar methods. According to one method, a low-melting-point alloy pellet of predetermined size and constituency is first placed in contact with the surface of the crystal element opposite the aluminum and gold layers, the alloy pellet including a donor impurity, such as antimony, and a metal such as gold, which is capable of readily dissolving silicon, but which has a relatively high rejection ratio with respect to silicon. The relative amounts of antimony and gold employed in the alloy pellet are not especially critical, but should be such as to provide a melting point for the alloy which is sufficiently low to permit the fusion operation to be carried out at temperature of the order of 500° C. The amount of antimony in the wire preferably should not exceed of the order of a few percent, however, since excessive antimony in the wire may promote cracking in the crystal element after the fused junction has been created. The crystal element and alloy pellet are then heated to a predetermined value of temperature above the melting point of the alloy, but below the melting point of silicon, to melt the alloy pellet and dissolve therein the immediately adjacent region of the silicon crystal element. It may be shown that the dissolution process is an equilibrium reaction and that the amount of silicon dissolved is readily controllable and is a function of the size and constituency of the alloy pellet and the temperature at which the fusion operation is carried out.

After the molten pellet has reached substantial equilibrium with the dissolved silicon, the silicon crystal and the molten alloy are cooled at a rate of the order of 100° C. per minute or less to redeposit or precipitate onto the silicon crystal element substantially all of the dissolved silicon, together with substituted atoms of antimony, thereby creating a regrown antimony-doped N-type region in the crystal element. Owing to the relatively high rejection ratio of gold with respect to silicon, the gold atoms in the molten alloy tend to remain in the liquid phase and are not regrown onto the silicon crystal element. When substantially all of the dissolved silicon has been redeposited upon the silicon element, the combination is further cooled to solidify the remainder of the dissolved silicon and antimony, together with the gold from the original alloy pellet, as an alloy button which extends above the surface of the crystal element and which is fused with and ohmically connected to the newly grown N-type region of silicon.

According to a modified method for creating the N-type region in the silicon crystal element, the silicon element is first heated to the desired fusion temperature, after which an antimony-gold alloy wire of predetermined thickness is advanced into contact with the crystal element to dissolve a portion of the crystal element and create the molten alloy region previously described. Thereafter the cooling steps described hereinabove are performed to create a regrown region of N-type silicon.

The principal advantage accruing from employing an alloy wire in lieu of an alloy pellet in the fusion operation is that the resultant N-type region, and consequently, the attached alloy button, is more readily centered with respect to the lateral boundaries of the crystal element. An additional advantage of this method is that pressure may be applied to the wire to break through any oxide layer which may have formed on the crystal element subsequent to the etching operation described hereinabove. It will be recognized, however, that the utilization of an alloy wire requires that the wire be advanced only a predetermined distance so that only a predetermined amount of the wire is melted, whereas the use of an alloy pellet permits control of the amount of alloy employed by merely controlling the size of the alloy pellet.

Referring now to Figs. 3*a*, 3*b*, and 3*c*, there is illustrated diagrammatically one form of apparatus for carrying out the fusion operation utilizing the alloy-wire technique. As shown in Fig. 3*a*, the apparatus includes a chamber 30 which has an intake port 32 and an exhaust port 34, intake port 32 being connected to a source 36 of a suitable gas, such as helium, for providing a non-oxidizing atmosphere within chamber 30. The apparatus also includes a dovetailed graphite block 37 for holding the crystal element to be operated upon, the graphite block being surrounded by a heater element 38 which is connected in series with a variable impedance 40 and is energizable from a source 42 of electrical energy upon closure of a switch 44.

In operation the fusion process is carried out by positioning a crystal element, generally designated 46, in the dovetailed slot in graphite block 37, substantially as shown, and adjusting the variable impedance 40 so that crystal element 46 is heated to a predetermined value of temperature upon closure of switch 44. After the switch has been closed, an antimony-gold wire 47 is introduced through exhaust port 34, for example, and is brought into contact with the upper surface of the crystal element and advanced a predetermined distance by a suitable mechanism, not shown, to create a molten alloy region 48 in the crystal specimen, as illustrated in Fig. 3*b*. Wire 47 is then withdrawn, after which the crystal element is controllably cooled by increasing the setting of variable impedance 40, and finally by opening switch 44. As shown in Fig. 3*c*, at the conclusion of the fusion operation, crystal element 46 includes a P-type region 49 having an aluminum layer 50 and a gold layer 52 ohmically connected thereto and an N-type region 54 separated from P-type region 49 by a rectifying barrier and ohmically contacted by an alloy button 56.

It may be recalled from the description set forth hereinabove that the amount of silicon dissolved during the fusion operation, and consequently the size and impurity content of the resultant N-type region, are determined by the amount and constituency of the alloy employed in carrying out the fusion operation and the temperature at which the operation is performed. It has been found that excellent fused junctions may be produced by heating the crystal element to a temperature within the range from 400° C. to 600° C., and advancing a .008 inch wire, consisting of the order of 99% gold and 1% antimony, ⅛ of an inch after contact is made between the wire and the crystal element. It should be re-emphasized that the constituency of the alloy wire may be varied to some extent, excellent fused junctions having been produced with alloys including of the order of .4% antimony and 99.6% gold. It should also be pointed out that the wire may include a homogeneous alloy of antimony and gold of the desired constituency, or may merely be an antimony-plated gold wire.

After the fusion operation has been completed, crystal element 46 is etched in a suitable etchant, such as a solution of one part nitric acid and one part hydrofluoric acid, to remove any shunt paths which may have formed across the external periphery of the rectifying barrier by the N-type region 54 or P-type region 49. The metallic layer of aluminum-gold on the crystal element is preferably protected from the action of the etchant by mounting the crystal element with its metallic layer against the bottom of a suitable container, such as a Petrie dish, for example, with a substance, such as Pliecene cement, which is relatively impervious to etching solutions. The crystal element is then etched for approximately 10 seconds by pouring a solution of one part nitric acid and one part hydrofluoric acid into the container, after which the container is sequentially flooded with distilled water and acetone to prevent further oxidation of the surface of the crystal element. The crystal element is then removed from the container and is rinsed in carbon tetrachloride to remove any Pliecene cement which might adhere to the gold layer. The crystal element is now ready to be connected to its associated electrodes and encapsulated.

With reference now to Figs. 4 through 8, there is shown a preferred form of the fused-junction silicon diode of the invention in various stages of production. As shown in Fig. 8, the completed diode includes a vitreous envelope 60 having first and second apertured ends through which extend two electrodes 62 and 64, respectively, which are hermetically sealed to the envelope. Silicon crystal element 46 is mounted on and ohmically connected to the inner end of electrode 62, while the inner end of electrode 64 is ohmically connected to alloy button 56 by a resilient metallic member 66. Although the fused-junction silicon diode shown in Fig. 8 may be manufactured by several methods, a preferred method is to fabricate separately a silicon crystal assembly and a contact assembly which are then joined together in a final sealing operation to form the integral unit shown in Fig. 8.

Referring now to Fig. 4, there is shown a preferred method of mounting crystal element 46 in a crystal housing sub-assembly, generally designated 68, to form the crystal assembly. Crystal housing sub-assembly 68 comprises electrode 62 and a vitreous tubular member 70 which is hermetically sealed to electrode 62. Vitreous member 70 may be composed of a suitable glass, such as Corning 012 glass, for example, while electrode 62 is preferably composed of an electrically conductive material, such as dumet, which has a coefficient of thermal expansion similar to that of glass. One process which has been found satisfactory for manufacturing the crystal housing sub-assembly is disclosed in copending U. S. patent application Serial No. 153,102 for "Glass-Sealed Semi-Conductor Crystal Device" by Harper Q. North et al., filed March 31, 1950, now Patent No. 2,694,168. According to this process, a glass bead of predetermined outside diameter is first threaded onto a metallic wire electrode and is fused to the electrode contiguous with one end thereof. The glass bead is then inserted in one end of a glass tube having an inside diameter slightly larger than the outside diameter of the glass bead, after which the bead and tube are fused together as with radiant heat, for example. In order to insure that the completed fused-junction silicon diode of the invention has low forward impedance and is mechanically rugged and temperature insensitive, it is essential that the silicon crystal element be mounted on its associated electrode with a mechanically strong and temperature-insensitive bonding material which is a good electrical conductor. More specifically, it has been found that the most satisfactory bonding material is a thermosetting compound including two separate ingredients, namely, an insulative thermosetting binder which forms a mechanically strong bond between the metallic layer on the crystal element and the associated electrode and which will not liquefy or carbonize within the temperature range to which the completed diode may be subjected, and a plurality of finely divided electrically conductive particles dispersed in the binder for providing a good ohmic connection between the crystal element and the electrode. One excellent bonding material which satisfies these requirements is Dupont No. 5780 thermosetting gold which is composed of 80% powdered gold dispersed in a thermosetting molymer resin which is thinned with a liquid consisting of 50% butyl—50% dibutyl Cellosolve.

Referring again to Fig. 4, the crystal mounting operation is preferably carried out by first picking up crystal element 46 with a vacuum chuck 72 which is energized from a vacuum source, not shown, to maintain the crystal element in position by atmospheric pressure. The gold layer 52 on the crystal element is then brought into contact with a pool of the thermosetting compound and is thereafter removed so that a daub 74 of the compound adheres to the gold layer. Vacuum chuck 72 and the attached crystal element are then inserted in crystal housing sub-assembly 68, substantially as shown in Fig. 4, and crystal element 46 is positioned atop the inner end of electrode 62, the daub of thermosetting compound thereafter adhering to both electrode 62 and the gold layer on the crystal element. Vacuum chuck 68 is then deactuated by the removal of its vacuum pressure, after which the chuck is withdrawn from the crystal housing sub-assembly.

The combination of the crystal housing sub-assembly and crystal element is then placed in an oven containing a non-oxidizing atmosphere, such as helium, and is heated to a temperature of the order of 100° C. for approximately one hour to volatilize the solvent or thinner in the thermosetting compound. The combination is then further heated sequentially for approximately 20 minutes at 200° C. and for approximately 30 minutes at 300° C. to polymerize the molymer in the thermosetting compound and thereby form a mechanically rigid temperature-insensitive insulative binder between electrode 62 and crystal element 46. The gold particles in the thermosetting compound are simultaneously bonded electrically with each other and with electrode 62 and gold layer 52 on the crystal element to provide an excellent low-impedance and non-rectifying connection between electrode 62 and P-type region 49 of the crystal element. The completed crystal assembly of the fused-junction silicon diode of the invention is illustrated in Fig. 5, the binder interconnecting crystal element 46 and electrode 62 being designated by the reference numeral 76. The silicon crystal assembly may now be joined with the diode contact assembly to form a completed fused-junction silicon diode of the invention.

Referring now to Fig. 6, there is shown a preferred form of contact assembly, generally designated 76, which may be utilized in the fused-junction silicon diodes of the invention. The contact assembly includes electrode 64 over which is fused a glass bead 78, substantially as shown. The outside diameter of bead 78 is preferably slightly less than the inside diameter of tubular vitreous member 70, as shown in Fig. 4. Resilient metallic member 66 is spot welded to the end of electrode 64 and is employed in the completed diode, as previously described, to connect electrode 64 electrically with the alloy button protruding from the silicon crystal element and thus ohmically interconnect electrode 64 with the N-type region of the crystal element.

Although member 66 is shown in Fig. 6 to be S-shaped, it will be recognized that other configurations, such as a C-shape, for example, may be employed to provide the desired resiliency in the member. In addition, it will be recognized that member 66 may be fabricated from any suitable electrically conductive material having satisfactory spring characteristics. A preferred method for producing the resilient member is to roll a platinum wire to produce a platinum ribbon, or strip, of the order of .002 of an inch in thickness and .020 of an inch in width, a predetermined length of the ribbon thereafter being spot welded to electrode 64 and kinked to the desired configuration. The relatively large width of the resilient member thus produced insures that reliable contact will be made with the alloy button protruding from the crystal element when the final assembly operation described below is carried out.

Referring now to Fig. 7, the final assembly operation is performed by advancing contact assembly 76 into the open end of vitreous tube 70 of the crystal assembly until resilient member 66 contacts alloy button 56. The contact assembly is thereafter advanced an additional distance of the order of .003 of an inch to stress resilient member 66 against the alloy button with a force of predetermined magnitude. This operation may be carried out by employing the assembling apparatus disclosed in the copending U. S. patent application Serial No. 268,385, for "Methods and Apparatus for Measuring Semiconductor Devices," by Justice N. Carman, Jr., filed January 9, 1952.

It will be noted from Fig. 7 that at the completion of the above-described advancing operation, vitreous bead 78 is positioned substantially within the open end of vitreous tube 70. After contact assembly 76 and the crystal assembly have been properly positioned relative to each other, localized heat is applied to the upper end of tube 70 adjacent bead 78 by a radiant energy heating source, for example, to fuse the bead with the vitreous tube, thereby forming a unitary vitreous envelope for the fused-junction silicon diode of the invention.

It should be pointed out that several intermediate operational steps may be performed in producing the fused-junction silicon diode of the invention before the final sealing operation is carried out. For example, it has been found that superior reverse current characteristics may be achieved in the completed diode by protecting the surface of the silicon crystal element from oxidation during the final sealing operation. This may be accomplished by placing a suitable inert material, such as Dow-Corning 200 silicone fluid, on the tip of resilient member 66 prior to the final sealing operation. When member 66 is thereafter brought into contact with the alloy button during the final sealing operation, the silicone fluid is spread over the adjacent surface of the crystal element by surface tension and serves to protect the surface from oxidation.

Still another modification which may be made in the methods of the invention alters the nature of the connection between alloy button 56 and contacting resilient member 66. Although a mere pressure contact between these elements has been found to produce a good electrical connection, it may be desirable to affix member 66 rigidly to the alloy button. This may be accomplished merely by pre-tinning member 66, before the final sealing operation is performed; when heat is thereafter applied to fuse together the vitreous elements of the contact and crystal assembly, the pre-tinned resilient member is fused to the top of the alloy button.

Referring once more to Fig. 8, it will be recognized that the fused-junction silicon diode of the invention is a hermetically sealed semiconductor device which is completely impervious to moisture, and in addition, is capable of operating without structural breakdown at any value of temperature at which silicon is capable of rectifying. Still another advantage of the encapsulating methods of the invention is that miniaturized fused-junction silicon diodes may be readily produced having electrical characteristics superior to those of diodes which are in order of magnitude larger in size. Typical dimensions of the vitreous envelope enclosing the fused-junction silicon diodes of the invention are .265 of an inch in length and .125 of an inch in diameter.

It may be recalled that the electrical characteristics of the fused-junction silicon diode of the invention are determined in part by the resistivity of the silicon material employed in the original silicon crystal elements. Typical electrical characteristics are tabulated below for fused-junction silicon diodes which have been produced utilizing silicon material of three different resistivities.

| | | | |
|---|---|---|---|
| Approximate resistivity of starting material ... cm.. | 1 | 4 | 8 |
| Average power Dissipation ... watt.. | ½ | ½ | ½ |
| Ambient temperature range ... °C.. | −80 to +300 | −80 to +300 | −80 to +300 |
| Saturation or zener voltage ... v.. | 60 | 150 | 200 |
| Voltage at which back current is at .1 microampere ... v.. | −25 | −50 | −75 |
| Forward current at +1 v ... ma.. | 15 | 5 | 3 |

It will be recognized that the fused-junction silicon diodes of the invention have exceptionally high rectification ratios with concomitant low back current and relatively high forward currents which are due in most part to the novel methods employed for creating the P-N junction in the silicon crystal elements and for creating a low impedance connection to the P-type region of the silicon specimen. It will also be noted that the diodes are capable of operating over an exceptionally large temperature range and may be utilized at temperatures which are higher than the temperatures whereat structural breakdown occurs in the semiconductor diodes of the prior art.

It should be understood, of course, that the foregoing disclosure relates only to a preferred embodiment of the invention and that numerous modifications may be made therein without departing from the scope and spirit of the invention, as set forth in the appended claims.

What is claimed as new is:

1. A fused-junction silicon diode comprising: a silicon crystal element having an acceptor-impurity-doped P-type region, an antimony-doped N-type region separated from said P-type region by a rectifying barrier, a layer of aluminum deposited on said P-type region and in ohmic contact therewith, a layer of gold deposited on said layer of aluminum, said gold layer blending with said aluminum layer, and an alloy button fused to said N-type region and in ohmic contact therewith, said alloy button including silicon, antimony, and gold; a first metallic electrode for supporting said crystal element, said first electrode having first and second ends; an insulative binder mechanically interconnecting said gold layer with said first end of said first electrode, said binder having gold particles dispersed therein to provide an ohmic connection between said first electrode and said P-type region; a vitreous tubular envelope for enclosing said crystal element, said envelope having first and second apertured ends, said first electrode extending through the aperture in said first end of said vitreous envelope and being hermetically sealed thereto whereby said crystal element is positioned within said envelope; a second metallic electrode having first and second ends, said second electrode extending through the aperture in said second end of said vitreous envelope and being hermetically sealed thereto whereby the first end of said second electrode extends within said envelope; and a resilient metallic element positioned within said envelope and electrically interconnecting said first end of said second electrode and said alloy button.

2. A fused-junction silicon diode comprising: a tubular vitreous envelope having first and second apertured ends; a silicon crystal element positioned within said envelope, said element including a first region of one conductivity type including a first active impurity, a second region of the opposite conductivity type including a second active impurity, and a metallic layer bonded to and in ohmic contact with said first region, said layer being composed essentially of a strata of gold separated from said first region of said crystal element by a strata of an active impurity of the type which determines the conductivity of said first region; an alloy button positioned within said envelope and fused to and in ohmic contact with said second region of said crystal element, said alloy button including atoms of silicon and of said second active impurity; first and second metallic electrodes extending through the apertures in said first and second ends of said vitreous envelope, respectively, and hermetically sealed to said envelope, each of said electrodes having one end positioned within said envelope; an insulative binder positioned within said envelope and mechanically bonding said strata of gold to said one end of said first electrode, said insulative binder having dispersed therein electrically conductive metallic particles to provide an ohmic electrical connection between said first electrode and said first region of said crystal element; and a resilient metallic element positioned within said envelope and interconnecting said alloy button and said one end of said second electrode.

3. A fused-junction silicon diode comprising: a tubular vitreous envelope having first and second apertured ends; a silicon crystal positioned within said envelope and having first and second opposite surfaces, said crystal having a first region of one conductivity type contiguous with said first surface and a second region of the opposite conductivity type contiguous with at least a portion of said second surface; a metallic layer bonded to and in ohmic contact with said first surface of said crystal, said layer being composed essentially of a strata of gold and a strata of an active impurity between said gold strata and said crystal, said active impurity in said strata being of the type which determines the conductivity of said first region; an alloy button fused to and in ohmic contact with said second region of said crystal, said alloy button including atoms of silicon and of the active impurity which determines the conductivity type of said second region; first and second metallic electrodes extending through the apertures in said first and second ends of said vitreous envelope, respectively, and hermetically sealed to said envelope, each of said electrodes having an end positioned within said envelope; means for conductively bonding said strata of gold to said one end of said first electrode; and a resilient metallic element interconnecting said alloy button and said one end of said second electrode.

4. A fused-junction silicon diode comprising: a silicon member having first and second opposite surfaces, said member having a P-type region contiguous with said first surface and an N-type region contiguous with at least a portion of said second surface and separated from said P-type region by a rectifying barrier; a layer of aluminum deposited on said first surface of said member and in ohmic contact therewith; a layer of gold deposited on said layer of aluminum, said gold layer blending with said aluminum layer; a first metallic electrode electrically connected to said gold layer; an alloy button fused to said N-type region at said second surface of said member and in ohmic contact therewith, said alloy button including silicon, antimony, and gold; a second metallic electrode; and a resilient metallic whisker ohmically interconnecting said alloy button with one end of said second electrode.

5. A fused-junction silicon diode comprising: a silicon crystal element including a first region of one conductivity type, a second region of the opposite conductivity type, and a metallic layer deposited on said first surface of said crystal element, said layer being composed essentially of a strata of gold separated from said first surface of said crystal element by a strata of an active impurity of the type which determines the conductivity of said first region; a metallic electrode electrically connected to said gold strata in non-rectifying relationship; an alloy button fused to and in ohmic contact with said second region of said crystal element, said alloy button including atoms of silicon and of the active impurity which determines the conductivity type of said second region; a second metallic electrode; and a resilient metallic member ohmically interconnecting said alloy button with one end of said second electrode.

6. In a fused-juncion silicon diode, a semiconductor element comprising: a silicon crystal having first and second opposite surfaces; a layer of aluminum of predetermined thickness deposited on said first surface of said crystal, said aluminum layer merging with said semiconductor crystal to provide an ohmic contact with said crystal, a layer of gold of predetermined thickness deposited on said aluminum layer, said gold layer merging with said aluminum layer, said silicon crystal having an acceptor-impurity-doped P-type region contiguous with said aluminum layer and a donor-impurity-doped N-type region contiguous with said second surface, said N-type region being separated from said P-type region by a rectifying barrier; and a metallic alloy button protruding above said second surface of said crystal and in ohmic contact with said N-type region, said alloy button being composed substantially of atoms of gold, silicon, and the donor impurity which determines the conductivity type of said N-type region.

7. The combination defined in claim 6 wherein the donor impurity in said N-type region is antimony and said alloy button is composed substantially of gold, silicon, and antimony.

8. In a fused-junction silicon diode, semiconductor element comprising: a silicon crystal having a P-type region including an acceptor impurity, an N-type region including a donor impurity, separated from said P-type region by a rectifying barrier; a metallic layer deposited on said P-type region, said layer being composed of a first strata of aluminum which merges with said P-type region and a second strata of gold which merges with said first strata; and a metallic alloy button protruding above and in ohmic contact with said N-type region, said alloy button being composed substantially of atoms of gold, silicon, and said donor impurity.

9. A fused-junction silicon diode comprising: a first metallic electrode; a silicon crystal element mounted on and ohmically connected to one end of said first electrode, said crystal element having a P-type region including an acceptor impurity adjacent said electrode and an N-type region including a donor impurity adjacent said P-type region; an alloy button fused to and in ohmic contact with said N-type region, said alloy button including atoms of gold, silicon, and of said donor impurity; a second metallic electrode; and a resilient metallic member ohmically interconnecting said alloy button with one end of said second electrode.

10. A fused-junction silicon diode comprising: a silicon crystal element having an acceptor-impurity-doped P-type region, a donor-impurity-doped N-type region separated from said P-type region by a rectifying barrier, a layer of aluminum deposited on said P-type region and in ohmic contact therewith, a layer of gold deposited on said layer of aluminum, said gold layer blending with said aluminum layer, and an alloy button fused to said N-type region and in ohmic contact therewith, said alloy button including silicon, antimony, and gold; a first metallic electrode electrically connected to said gold layer; a second metallic electrode electrically connected to said alloy button; and a tubular vitreous envelope for housing said crystal element and said vitreous envelope having first and second ends hermetically sealed to said first and second metallic electrodes, respectively.

11. A fused-junction silicon diode comprising: a silicon crystal element having first and second opposite surfaces, said crystal element having a P-type region contiguous with said first surface and an antimony-doped N-type region contiguous with at least a portion of said second surface and separated from said P-type region by a rectifying barrier; a first metallic electrode electrically connected to said P-type region; an alloy button fused to said N-type region at said second surface and in ohmic contact therewith, said alloy button including silicon, antimony, and gold; a second metallic electrode; and a resilient metallic whisker element ohmically interconnecting said alloy button with one end of said second electrode.

References Cited in the file of this patent

UNITED STATES PATENTS

| | | |
|---|---|---|
| 2,561,411 | Pfann | July 24, 1951 |
| 2,623,102 | Shockley | Dec. 23, 1952 |
| 2,697,052 | Dacey | Dec. 14, 1954 |

OTHER REFERENCES

Armstrong: Proceedings of the Institute of Radio Engineers, No. 11, vol. 40, November 1952, pages 1341 and 1342.